United States Patent
Eva et al.

(10) Patent No.: US 11,120,887 B2
(45) Date of Patent: Sep. 14, 2021

(54) METHOD FOR WRITING IN A VOLATILE MEMORY AND CORRESPONDING INTEGRATED CIRCUIT

(71) Applicant: STMicroelectronics (Rousset) SAS, Rousset (FR)

(72) Inventors: Christophe Eva, Rousset (FR); Jean-Michel Gril-Maffre, Aix-en-Provence (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/096,090

(22) Filed: Nov. 12, 2020

(65) Prior Publication Data

US 2021/0158887 A1 May 27, 2021

(30) Foreign Application Priority Data

Nov. 21, 2019 (FR) ...................... 1913001

(51) Int. Cl.
*G11C 29/42* (2006.01)
*G11C 7/10* (2006.01)
*G11C 29/44* (2006.01)

(52) U.S. Cl.
CPC .......... *G11C 29/42* (2013.01); *G11C 7/1045* (2013.01); *G11C 7/1057* (2013.01); *G11C 7/1084* (2013.01); *G11C 29/44* (2013.01)

(58) Field of Classification Search
CPC ..... G11C 29/42; G11C 7/1045; G11C 7/1057; G11C 7/1084; G11C 7/10
See application file for complete search history.

(56) References Cited

U.S. PATENT DOCUMENTS

| | | | |
|---|---|---|---|
| 2010/0162068 A1 | 6/2010 | Toda | |
| 2014/0040550 A1* | 2/2014 | Nale | G06F 13/1668 711/118 |
| 2020/0135270 A1* | 4/2020 | Lee | G06F 12/0873 |
| 2020/0272362 A1* | 8/2020 | Kim | G06F 11/1048 |

FOREIGN PATENT DOCUMENTS

FR 2864321 A1 6/2005

* cited by examiner

*Primary Examiner* — Han Yang
(74) *Attorney, Agent, or Firm* — Slater Matsil, LLP

(57) ABSTRACT

An embodiment method for writing to a volatile memory comprises at least receiving a request to write to the memory, and, in response to each request to write to the memory: preparation of data to be written to the memory, this comprising computing an error correction code; storing in a buffer register the data to be written to the memory; and, if no new request to write to or to read from the memory is received after the storage, writing to the memory of the data to be written stored in the buffer register.

20 Claims, 4 Drawing Sheets

METHOD FOR WRITING IN A VOLATILE MEMORY AND CORRESPONDING INTEGRATED CIRCUIT

CROSS-REFERENCE TO RELATED APPLICATIONS

This application claims the benefit of French Application No. 1913001, filed on Nov. 21, 2019, which application is hereby incorporated herein by reference.

TECHNICAL FIELD

Embodiments and modes of implementation relate to integrated circuits, for example the integrated circuits of systems-on-chips, comprising a random-access memory using an error correction code.

BACKGROUND

Error correction codes (or ECC), typically in the form of a Hamming code, allow at least one error in a memory word of a memory to be detected and corrected. An error correction code is computed knowing all the data of a memory word to which it is dedicated.

A memory word is conventionally a unit of the organization of and of the access to a memory. A memory word typically comprises a plurality of data bits, or a plurality of bites of eight data bits, and the bits of the dedicated error correction code.

This being so, certain memories allow data to be written with a granularity smaller than one memory word, for example a granularity of one byte or of one bit, and the error correction code must be recomputed on the modified and complete new memory word. Typically, provision is made for old non-modified data to be read before writing the new memory word and its error correction code.

Solutions propose to insert steps of reading, of computing the code and of writing two successive write instructions, and, a new modified memory word is stored in a buffer register until the next write instruction, on which it will be written to the memory.

Thus, if the memory device is reset, the data stored in the buffer register are lost, even though they have been commanded to be written to the random-access memory.

By reset what is meant is a reset commanded by a signal of the "reset" type, contrary to a restart or a break in power supply. A random-access memory, for example of the static random-access-memory type (i.e. SRAM) does not necessarily lose stored data in case of reset.

SUMMARY

Modes of implementation and embodiments make it possible to no longer lose data supposed to actually be written to the random-access memory, in particular in case of reset of the system.

According to one aspect, a method for writing to a volatile memory is thus proposed, the method comprising at least receiving a request to write to the memory, and, in response to each request to write to the memory: preparation of data to be written to the memory, this comprising computing an error correction code; storing in a buffer register the data to be written to the memory; and, if no new request to write to or to read from the memory is received after the storage, writing to the memory the data to be written stored in the buffer register.

In other words, it is proposed to systematically store the last data to be written prepared in a buffer register. However, instead of adding a series of successive write operations, which would result in a cumulative delay, a write operation is added only at the advantageous point when the memory is free, i.e. when there is no need to read to or read from the memory.

According to one mode of implementation, the method furthermore comprises, if a new request to write to the memory is received after the storage, writing to the memory the data to be written stored in the buffer register before the storage in the buffer register of the following data to be written to the memory, i.e. the data prepared in response to the new request to write to the memory.

Thus, the method benefits both from a saving in time in the case of a series of successive write requests, and from security with respect to the loss of the last data, in particular in the case of reset.

According to one mode of implementation, the request to write to the memory comprises a memory address of the memory and new data having a size smaller than the size of a memory word of the memory, the preparation of the data to be written comprises reading prior data stored beforehand in the memory word containing the memory address, and the computation of the error correction code is computed on a combination of the prior data and of the new data, the data to be written comprising the combination of data and the error correction code thus computed.

According to one mode of implementation, the at least one request to access the memory is transmitted over a bus and comprises activating a selection signal on one channel of an advanced system bus, the method comprising detecting the activation or not of the selection signal in order to evaluate whether no request for write or read access to the memory is received after the storage.

According to another aspect, an integrated circuit is proposed, the integrated circuit comprising a volatile memory and a control interface of the memory, which is intended to receive at least one request to write to the memory, and configured, in response to a request to write new data to the memory, to: prepare data to be written to the memory and to compute an error correction code; store in a buffer register the data to be written to the memory; and, if no new request to write to or to read from the memory is received after the storage, command the data to be written stored in the buffer register to be written to the memory.

According to one embodiment, the control interface is furthermore configured to, if a new request to write to the memory is received after the storage, write to the memory the data to be written stored in the buffer register before storing in the buffer register the following data to be written to the memory, i.e. the data prepared in response to the new request to write to the memory.

According to one embodiment, the control interface is configured, as defined above, in response to a write request comprising a memory address of the memory and new data having a size smaller than the size of a memory word of the memory, and the control interface of the memory is configured to read prior data stored beforehand in the memory word containing the memory address, and to compute the error correction code on a combination of the prior data and of the new data, in order to prepare data to be written comprising the combination of data and the error correction code thus computed.

According to one embodiment, the control interface of the memory comprises a forced writing circuit configured to evaluate whether no request to write to or to read from the memory is received after the storage, and to command the write to the memory of the data to be written stored in the buffer register in the absence of writing to and of reading from the memory.

According to one embodiment, the volatile memory is of the static random-access-memory type.

According to one embodiment, the control interface of the memory is configured to receive the at least one request to access the memory over a bus, and the control interface of the memory is configured to detect the activation or not of a selection signal on one channel of the bus in order to evaluate whether no request for write or read access to the memory is received after the storage.

A system-on-chip is also proposed, the system-on-chip comprising an integrated circuit such as defined above, a bus, and a master device capable of transmitting requests to write to the memory to the control interface of the memory via the bus.

BRIEF DESCRIPTION OF THE DRAWINGS

Other advantages and features of the invention will become apparent on examining the detailed description of completely nonlimiting modes of implementation and embodiments, and the appended drawings, in which.

DETAILED DESCRIPTION OF ILLUSTRATIVE EMBODIMENTS

Figure 1:
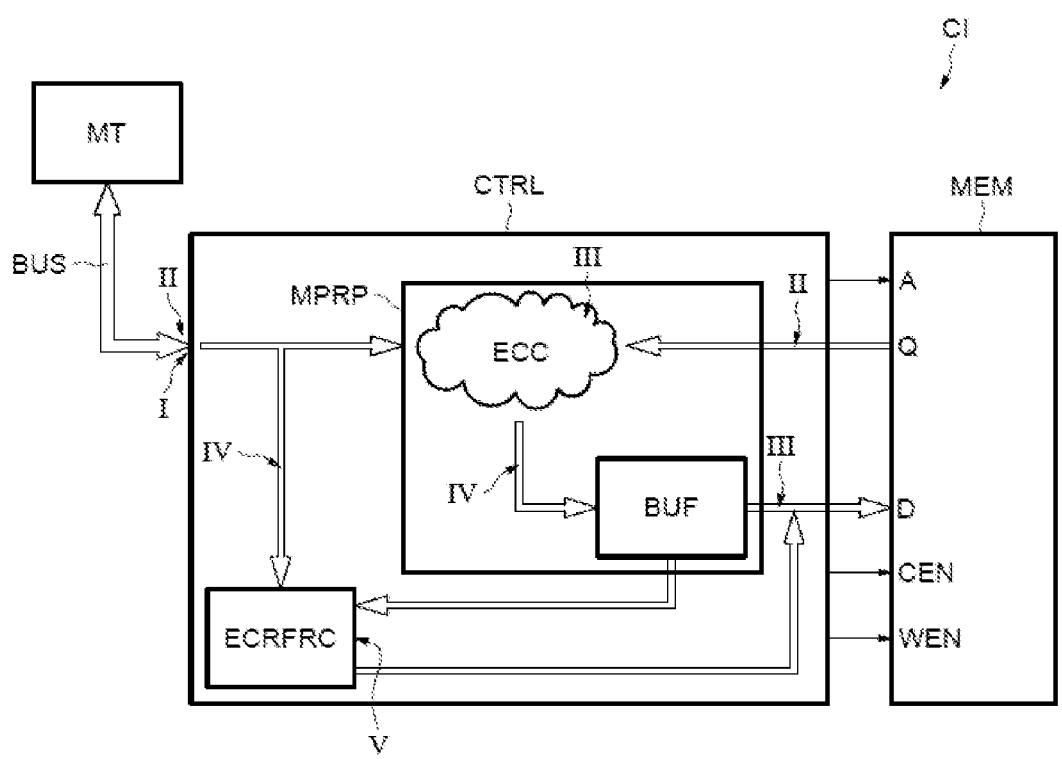
FIG. 1 illustrates a block diagram of a system-on-chip.

FIG. 1 illustrates a system-on-chip CI, produced in an integrated way.

The system-on-chip CI comprises a master device MT, for example a microcontroller processor, and an integrated circuit comprising a random-access memory MEM and a control interface CTRL of the memory.

The random-access memory MEM is for example an SRAM (static random-access memory), and the control interface allows the memory MEM to be commanded in response to instructions or requests transmitted by the master device MT over a bus BUS, for example an advanced high-performance bus (AHB).

The control interface CTRL of the memory is configured to receive the communications of the master device MT over the bus BUS, to decode this information employing the protocol used and to execute the requests received by generating internal signals that command the memory.

Thus, the control interface CTRL is configured to generate an address signal on the address line A, a data signal on the data line D, an inverted device-activation signal CEN, and an inverted write-command signal WEN, and to read a signal Q output from the memory, such signals being described below with reference to FIG. 4.

The control interface CTRL of the memory comprises a circuit MPRP for preparing write data capable of implementing an error-correction-code mechanism ECC, and to temporarily store in a buffer register BUF the data to be written to the memory.

The control interface CTRL of the memory furthermore comprises a writing means, called the "forced" writing means, ECRFRC, which is configured to evaluate, for example on at least certain signals of the bus BUS, whether no request to write to or to read from the memory is received after the storage of the last data prepared in the buffer register BUF.

Furthermore, if no request to access the memory is received, the forced writing means ECRFRC is configured to command data to be written stored in the buffer register BUF to be written to the memory MEM while the memory is neither in the process of being read from nor in the process of being written to.

Figure 2:
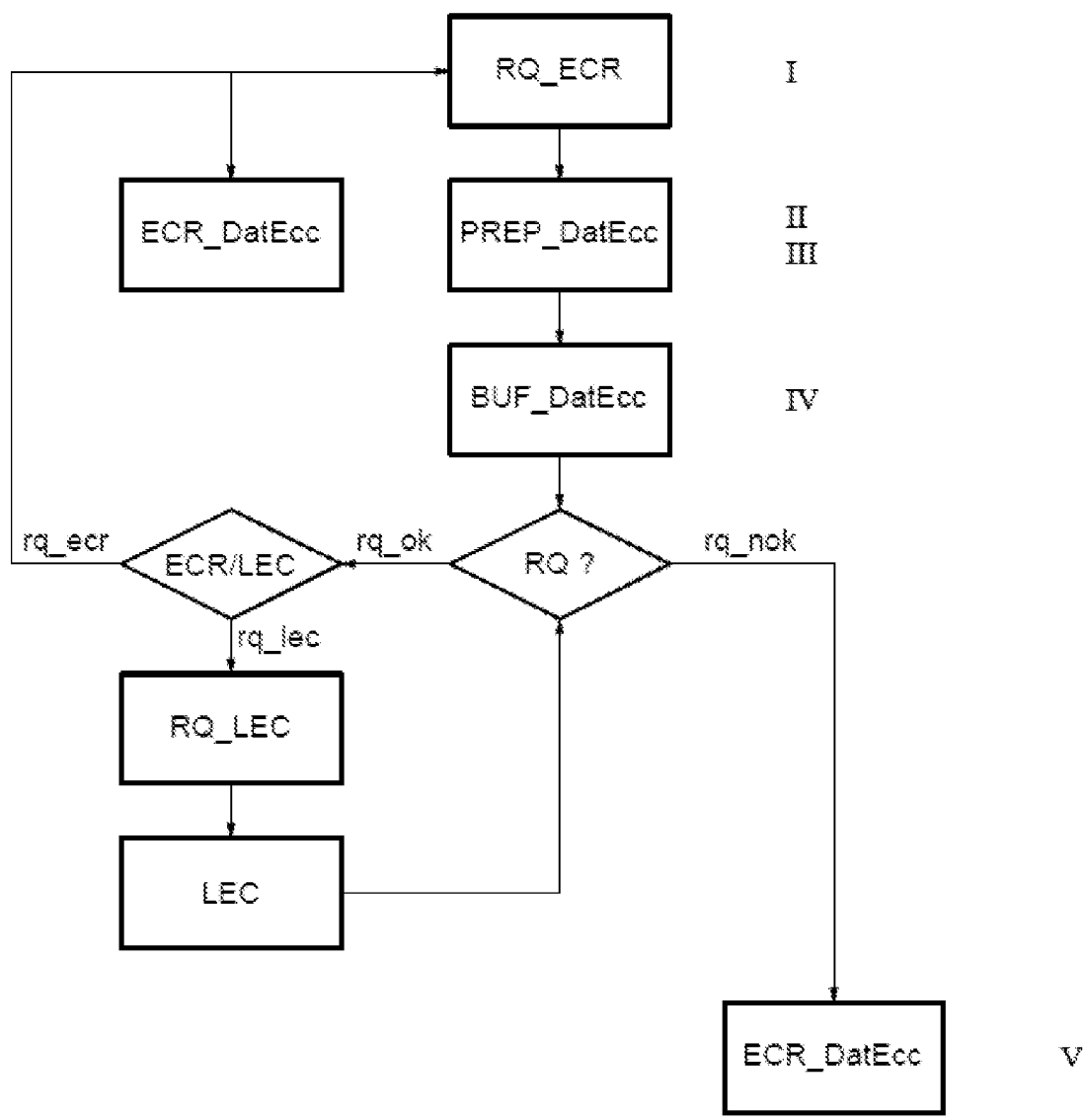
FIG. 2 illustrates a flow chart of an example write to a memory.
Figure 3:
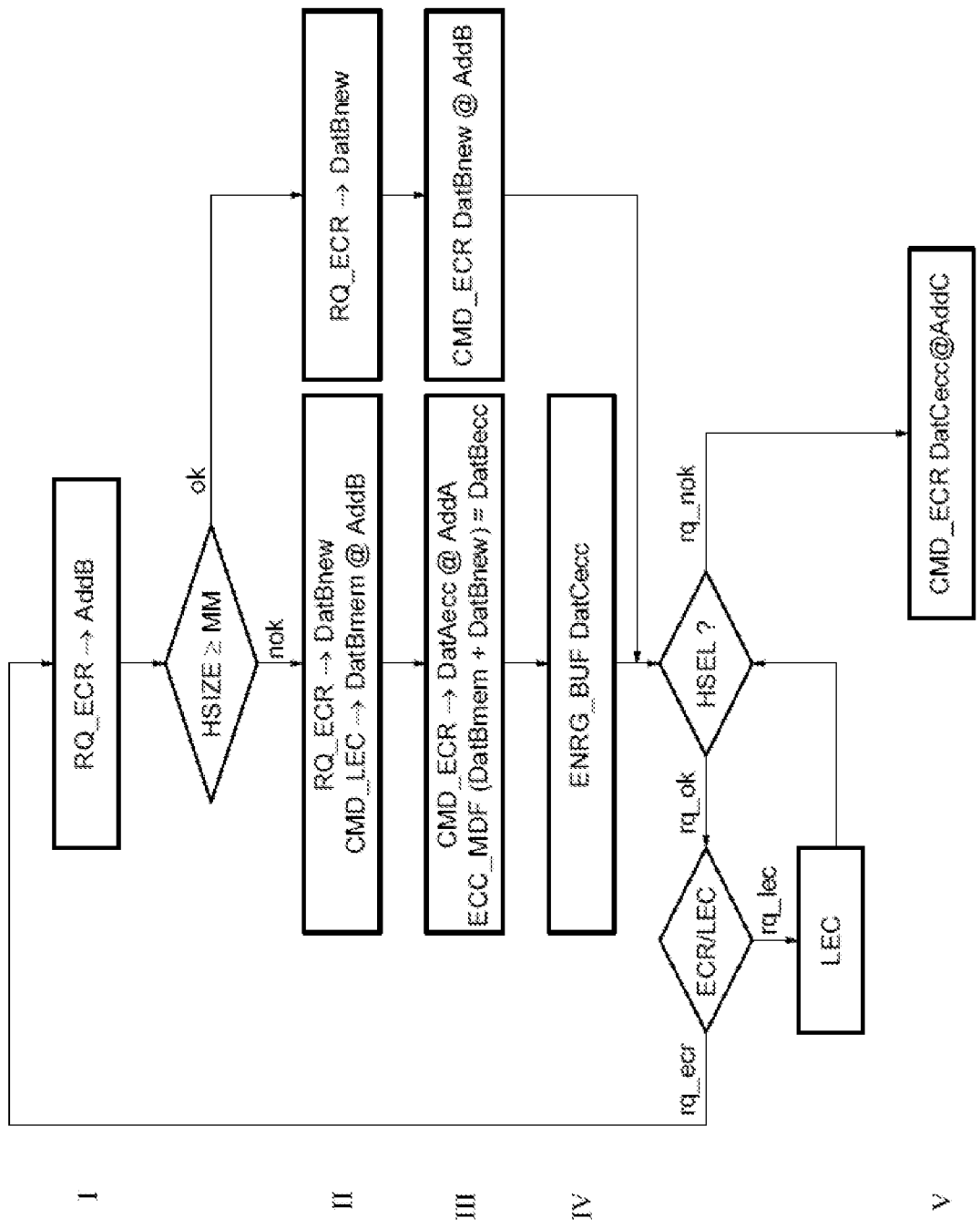
FIG. 3 illustrates a flow chart of an example write to a memory in the context of a request made using a communication protocol over a microcontroller bus of the AHB type specified in the AMBA standard.
Figure 4:
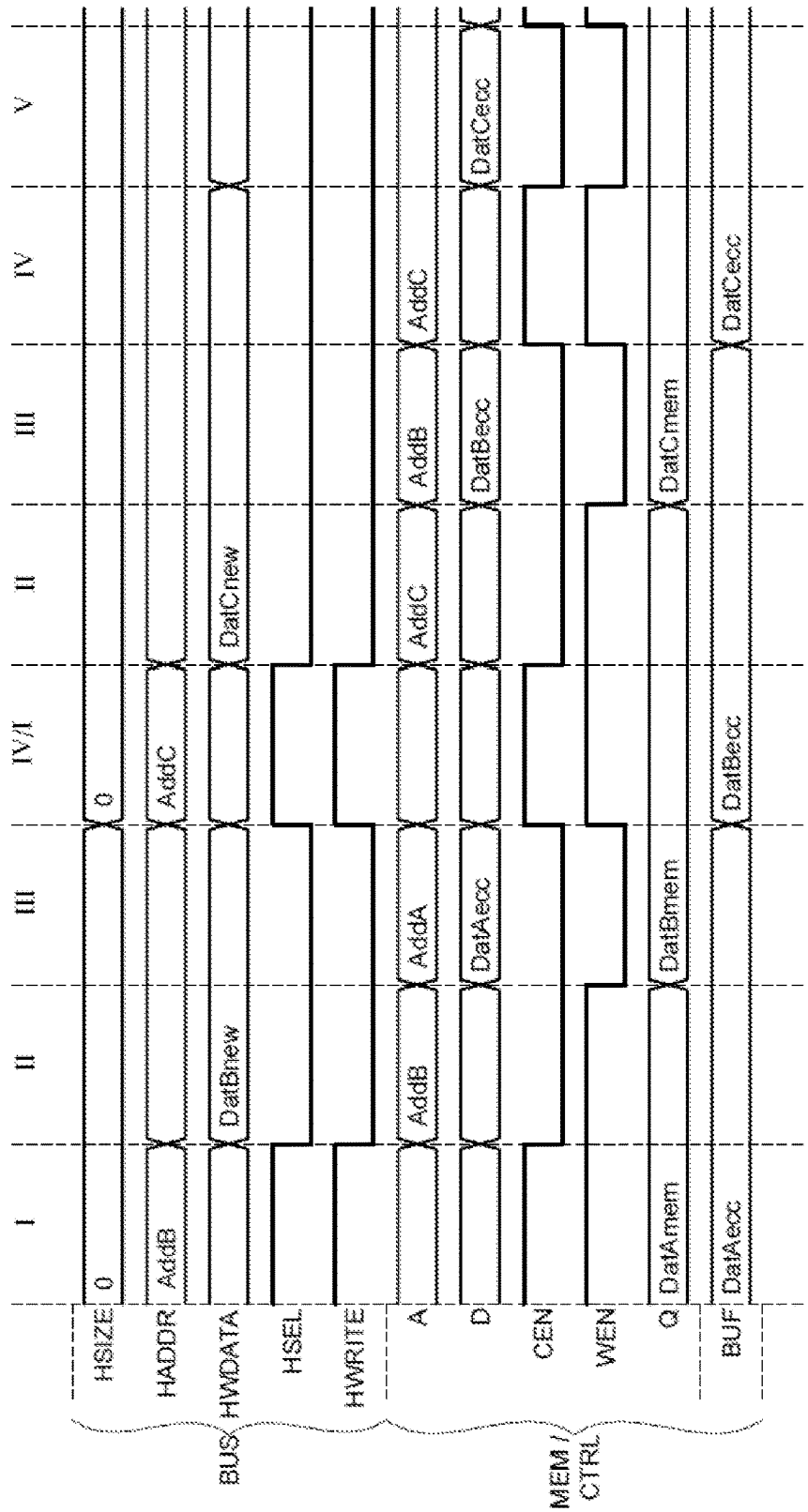
FIG. 4 illustrates a timing diagram of an example write to a memory in the context of a request made using a communication protocol over a microcontroller bus of the AHB type specified in the AMBA standard.

The references I, II, III, IV, V schematically represent in FIG. 1 the way in which the five respective phases described below with reference to FIG. 2 or to FIGS. 3 and 4 are implemented.

Thus, a write access request of the first phase I is received by the control interface CTRL over the bus BUS.

A preparation of the data to be written to the memory comprises reading old data from the memory MEM, in the second phase II, which data are transmitted to the preparing means MPRP over the output line Q of the memory, at the end of the second phase II.

New data to be written are for example received over the bus BUS in the second phase II.

A computation of the error correction code ECC is executed on a combination of the old data and of the new data, by the data-preparing circuit MPRP in the third phase III.

Data previously prepared and temporarily stored in the buffer register BUF are sent over the data line D of the memory, in the third phase III, thus freeing the buffer register to receive the data in the process of being prepared. A write of the received data over the data line D is commanded by the signals CEN and WEN.

When the computation of the error correction code has ended, at the end of the third phase III, the data prepared to be written to the memory are stored in the buffer register BUF, in the fourth phase IV.

At the same time, the forced writing means ECRFRC is configured to evaluate, on at least one channel of the bus BUS, for example a selection channel HSEL (FIG. 4), whether a new memory read or write operation is required, at the start of the fourth phase IV.

If a request is received, the fourth phase IV is superposed on the new first phase I of the new request.

If no request is detected, the forced writing means ECRFRC commands a write of the data present in the buffer register BUF in a fifth phase V.

For example, the forced writing means ECRFRC may be configured to have access to the buffer register BUF and to transfer the data from the register over the data channel D of the memory MEM.

Thus, if the system CI is for example reset and the buffer register BUF is emptied, the last data prepared to be written have actually been written to the memory MEM and are not lost.

FIG. 2 shows an example of a mode of implementation of a write to a memory, in response to a write request RQ_ECR.

The method according to this example is intended to be implemented by a control interface CTRL of the memory (FIG. 1). The memory is for example a static random-access memory (SRAM) organized into memory words. The memory is capable of receiving data to be written having a size smaller than a memory word and uses an error-correction-code mechanism attributed to each memory word.

In a first phase I, a request RQ_ECR for write access to the memory is received. The write request RQ_ECR may originate from a master device and may comprise an address of the memory and the new data to be written to the memory at this address.

The new data are considered to have a size smaller than the size of a memory word of the memory.

In a second phase II, the data to be written to the memory are prepared PREP_DatEcc, and a computation of an error correction code will be executed. The computation uses all the bits of the memory word, in which is included the address of the request.

Thus, prior data recorded beforehand in the memory word containing the address of the request are first read in the second phase II.

The prior data read beforehand from the memory are transmitted to the control interface.

In a third phase III, the error correction code is computed on the data read from the memory and combined with the new data of the present request RQ_ECR.

In parallel to the preparation PREP_DatEcc of the data to be written, data to be written prepared beforehand are written ECR_DatEcc to the memory, in the third phase III.

In a fourth phase IV, the data to be written output from the preparation PREP_DatEcc are stored BUF_DatEcc in a buffer register, emptied for the write ECR_DatEcc of the data to be written prepared beforehand.

Next, a test RQ makes it possible to evaluate whether a new request for write or read access to the memory is received rq_ok, or not rq_nok.

In case of reception of a new request rq_ok, a distinction ECR/LEC is made between a new write request rq_ecr and a new read request rq_lec.

If a write request rq_ecr is received, then phases I, II, III and IV such as described above are executed with the new write request RQ_ECR, and in particular comprise writing ECR_DatEcc the data to be written, stored BUF_DatEcc in the buffer register in phase IV described above.

If a read request RQ_LEC is received rq_lec, then the read LEC is implemented, then the test RQ is carried out again.

If no new request rq_nok to write to or to read from the memory is received, then the last data to be written stored in the buffer register are written ECR_DatEcc to the memory, in a fifth phase V, in the absence of writing to and reading from the memory.

Thus, the method according to this example makes it possible to not store in the buffer register the last data prepared to be written to the memory, without however constraining or delaying the execution of new write or read requests RQ_ECR, RQ_LEC subsequent to the preparation PREP_DatEcc and storage BUF_DatEcc of the data to be written.

The exemplary method described above with reference to FIG. 2 may of course be adapted to any operation of writing to a memory making provision for an error correction code and such a use of a buffer register, depending on the various transmission-request protocols used.

FIGS. 3 and 4 illustrate in this respect an example of application of the method as described above with reference to FIG. 2 in the context of a request made using a communication protocol over a microcontroller bus of the AHB (advanced high-performance bus) type specified in the AMBA (advanced microcontroller bus architecture) standard, which is well known to those skilled in the art.

FIG. 3 shows the steps of the method according to this example and FIG. 4 shows the signals employed on the bus BUS and the control interface CTRL of the memory MEM in this example.

The references of the signals employed on the bus BUS will be used below to designate both the channels of the bus BUS and the signals transmitted over these channels.

Cycles I, II, III, IV, and V, are defined by the AHB protocol and correspond operationally to the respective phases of the method described above with reference to FIG. 2.

The first cycle I corresponds to a control cycle of the AHB protocol, a write request RQ_ECR is communicated to the memory via a transmission of the address AddB of the new data to be written over a respective channel HADDR of the bus BUS, and via an activation of a selection signal HSEL and of a write control signal HWRITE on respective channels of the bus BUS.

In the first cycle I, information on the size of the data to be written (which are not yet transmitted) is communicated on a respective channel HSIZE of the bus BUS.

If the size HSIZE of the data to be written is equal to the size of a memory word MM of the memory, then a direct write CMD_ECR of the new data DatBnew is commanded to the word of the address AddB transmitted in the request RQ_ECR, after the transmission of the new data DatBnew (see the second cycle II below).

If the size HSIZE of the data to be written is smaller than the size of a memory word MM of the memory, then the data to be written are prepared in the following way.

In the second cycle II, the new data DatBnew of the write request RQ_ECR are transmitted on a respective channel HWDATA of the bus BUS.

The address AddB is loaded on an address line A of the memory MEM, and the memory MEM is commanded CMD_LEC to read from the address AddB by setting to o an inverted device-activation signal CEN, and maintaining at 1 an inverted write signal WEN.

In the third cycle III, the data read from the memory DatBmem are transmitted to the control interface over an output Q of the memory.

An address AddA of data prepared beforehand is loaded on the address line A of the memory, and prior data DatAecc prepared beforehand are loaded on a data-input line D of the memory, from a buffer register BUF of the control interface. The prior data DatAecc prepared beforehand result from a proceeding preparation of data, as described below under the reference ECC_MDF.

The memory MEM is commanded in write mode CMD_ECR by setting to o the inverted device-activation signal CEN, and setting to o the inverted write signal WEN. This corresponds to an activation of the write control signal on the line WEN.

The write is executed at the address AddA of the prior data, which is loaded on the address line A, with the prior data DatAecc prepared beforehand, which are loaded on the data line D of the memory and originate from the buffer register BUF of the control interface.

In parallel, during the third cycle III, the control interface prepares ECC_MDF the next data DatBecc to be written, by combining the data DatBmem read from the memory at the address AddB of the present request, with new data AddBnew, and by computing the new error correction code attributed to the new memory word comprising the combination of the data DatBmem and DatBnew.

After writing, during the fourth cycle IV, the prepared data DatBecc are stored in the buffer register ENRG_BUF of the control interface of the memory.

At the same time, a test is carried out on the selection channel HSEL of the bus BUS in order to verify whether a new request to access the memory is emitted by a master device.

If HSEL is activated (at 1), then a new request is received rq_ok. The new request may be a read request rq_lec or a write request rq_ecr depending on the signal ECR/LEC (1 and 0, respectively) on the write command channel HWRITE.

In case of reception of a read request rq_lec, a read LEC from the memory is commanded, whereas the prepared data DatBecc remain stored in the buffer register BUF.

In case of reception of a write request rq_ecr, as illustrated by FIG. 4, a new write such as described above is implemented for another address AddC and for other new data DatCnew.

The prepared data DatBecc are loaded on the data line D and written to the memory MEM in the third cycle III of this new write. Other data to be written to the memory DatCecc are prepared ECC_MDF and stored in the buffer register ENRG_BUF in new third and fourth cycles III, IV.

In the absence of reception of a new request rq_nok in the fourth cycle IV, i.e. if the signal HSEL is not activated (at 1) during the fourth cycle IV, then a write cycle (fifth cycle V) is "forced" by the control interface CTRL.

As illustrated in FIG. 4, at the end of the second write, during the fifth cycle V, the last data DatCecc to be written stored in the buffer register are written to the memory, while the memory is neither required to be written to, nor required to be read from.

Thus, the write to the memory is effectively achieved, and a reset signal may be emitted without risking losing the last data DatCecc prepared from the buffer register.

Moreover, the invention is not limited to these embodiments and modes of implementation but encompasses all the variants thereof; for example, the invention may be adapted to other types of memory making provision for an error correction code and use of a buffer register that temporarily stores data to be written.

What is claimed is:

1. A method for writing to a volatile memory, the method comprising:
   receiving a first request to write to the memory;
   first preparing first data to be written to the memory, the first preparing comprising computing a first error correction code;
   first storing in a buffer register the first data; and
   in response to not receiving a new request to write to or read from the memory after the first storing, writing to the memory of the first data stored in the buffer register.

2. The method according to claim 1, furthermore comprising:
   receiving a second request to write to the memory;
   second preparing second data to be written to the memory, the second preparing comprising computing a second error correction code;
   second storing in the buffer register the second data; and
   in response to receiving an additional request to write to the memory after the second storing, writing to the memory the second data stored in the buffer register before third storing in the buffer register of additional data to be written to the memory and prepared in response to the additional request to write to the memory.

3. The method according to claim 1, the first request to write to the memory comprising a memory address of the memory and new data having a size smaller than a size of a memory word of the memory, the first preparing the first data to be written comprising reading prior data stored beforehand in the memory word containing the memory address, the computing the first error correction code performed on a combination of the prior data and the new data, and the first data to be written comprising a combination of the new data and the first error correction code.

4. The method according to claim 1, wherein any request to write to or to read from the memory is transmitted over a bus and comprises activating a selection signal on one channel of the bus, the method comprising detecting whether the selection signal is activated in order to evaluate whether no request for write or read access to the memory is received after the first storing.

5. The method according to claim 1, further comprising:
   evaluate whether no request to write to or to read from the memory is received after the storing; and
   command the write to the memory of the first data stored in the buffer register in an absence of writing to and reading from the memory.

6. The method according to claim 1, wherein the volatile memory is a static random access memory.

7. An integrated circuit comprising:
   a volatile memory; and
   a control interface of the memory, the control interface configured to:
      receive a request to write to the memory;
      prepare data to be written to the memory and to compute an error correction code;
      store in a buffer register the data to be written to the memory; and
      in response to no new request to write to or to read from the memory being received after the storage, command the data stored in the buffer register to be written to the memory.

8. The integrated circuit according to claim 7, wherein the control interface is further configured to:
   in response to a new request to write to the memory being received after the storage, write to the memory the data stored in the buffer register before storing in the buffer register new data to be written to the memory in response to the new request to write to the memory.

9. The integrated circuit according to claim 7, wherein the control interface further configured to:
   in response to a write request comprising a memory address of the memory and new data having a size smaller than a size of a memory word of the memory, wherein the control interface of the memory is configured to read prior data stored beforehand in the memory word containing the memory address, and to compute the error correction code on a combination of the prior data and the new data, in order to prepare the data to be written comprising a combination of the new data and the error correction code.

10. The integrated circuit according to claim 7, wherein the control interface of the memory comprises a forced writing circuit configured to:
   evaluate whether no request to write to or to read from the memory is received after the storage; and
   command the write to the memory of the data stored in the buffer register in an absence of writing to and reading from the memory.

11. The integrated circuit according to claim 7, wherein the volatile memory is a static random access memory.

12. The integrated circuit according to claim 7, wherein the control interface of the memory is configured to:
   receive any requests to write to or to read from the memory over a bus; and
   detect activation of a selection signal on one channel of the bus in order to evaluate whether no request for write or read access to the memory is received after the storage.

13. The integrated circuit according to claim 12, wherein the integrated circuit comprises an advanced high-performance bus interface coupled to the bus.

14. A system-on-chip comprising:
   an integrated circuit comprising:
      a volatile memory; and
      a control interface of the memory, the control interface configured to:
         receive a request to write to the memory;
         prepare data to be written to the memory and to compute an error correction code;
         store in a buffer register the data to be written to the memory; and
         in response to no new request to write to or to read from the memory being received after the storage, command the data stored in the buffer register to be written to the memory
   a bus; and
   a master device configured to transmit requests to write to the memory to the control interface of the memory via the bus.

15. The system-on-chip according to claim 14, wherein the control interface is further configured to:
   in response to a new request to write to the memory being received after the storage, write to the memory the data stored in the buffer register before storing in the buffer register new data to be written to the memory in response to the new request to write to the memory.

16. The system-on-chip according to claim 14, wherein the control interface further configured to:
   in response to a write request comprising a memory address of the memory and new data having a size smaller than a size of a memory word of the memory, wherein the control interface of the memory is configured to read prior data stored beforehand in the memory word containing the memory address, and to compute the error correction code on a combination of the prior data and the new data, in order to prepare the data to be written comprising a combination of the new data and the error correction code.

17. The system-on-chip according to claim 14, wherein the control interface of the memory comprises a forced writing circuit configured to:
   evaluate whether no request to write to or to read from the memory is received after the storage; and
   command the write to the memory of the data stored in the buffer register in an absence of writing to and reading from the memory.

18. The system-on-chip according to claim 14, wherein the volatile memory is a static random access memory.

19. The system-on-chip according to claim 14, wherein the control interface of the memory is configured to:
   receive any requests to write to or to read from the memory over the bus; and
   detect activation of a selection signal on one channel of the bus in order to evaluate whether no request for write or read access to the memory is received after the storage.

20. The system-on-chip according to claim 14, wherein the bus is an advanced high-performance bus compliant with an advanced microcontroller bus architecture standard.

* * * * *